(12) United States Patent
Kokumai

(10) Patent No.: US 9,059,087 B2
(45) Date of Patent: Jun. 16, 2015

(54) SOI SUBSTRATE, METHOD FOR MANUFACTURING SOI SUBSTRATE, AND METHOD FOR MANUFACTURING SEMICONDUCTOR DEVICE

(71) Applicant: CANON KABUSHIKI KAISHA, Tokyo (JP)

(72) Inventor: Kazuo Kokumai, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/921,063

(22) Filed: Jun. 18, 2013

(65) Prior Publication Data

US 2013/0341755 A1  Dec. 26, 2013

(30) Foreign Application Priority Data

Jun. 20, 2012  (JP) .................................. 2012-138384

(51) Int. Cl.
| | |
|---|---|
| H01L 21/76 | (2006.01) |
| H01L 23/28 | (2006.01) |
| H01L 29/02 | (2006.01) |
| H01L 31/0232 | (2014.01) |
| H01L 21/18 | (2006.01) |
| H01L 31/02 | (2006.01) |
| H01L 21/762 | (2006.01) |
| H01L 27/146 | (2006.01) |

(52) U.S. Cl.
CPC ................ *H01L 23/28* (2013.01); *H01L 29/02* (2013.01); *H01L 31/0232* (2013.01); *H01L 21/185* (2013.01); *H01L 31/02* (2013.01); *H01L 21/76256* (2013.01); *H01L 27/14689* (2013.01); *H01L 2924/0002* (2013.01)

(58) Field of Classification Search
CPC .................. H01L 21/76224; H01L 21/76264; H01L 21/763; H01L 21/76229; H01L 21/76232
USPC ........... 438/207, 218, 219, 294, 427; 257/506
See application file for complete search history.

(56) References Cited

U.S. PATENT DOCUMENTS

| | | | |
|---|---|---|---|
| 2002/0070454 A1 | 6/2002 | Yasukawa | |
| 2009/0090990 A1* | 4/2009 | Niimi et al. | 257/500 |
| 2009/0098710 A1 | 4/2009 | Yamazaki | |
| 2010/0006940 A1 | 1/2010 | Kakehata | |
| 2010/0090303 A1* | 4/2010 | Takizawa | 257/432 |
| 2011/0062540 A1* | 3/2011 | Saito et al. | 257/432 |
| 2011/0120374 A1* | 5/2011 | Bevan et al. | 118/719 |
| 2011/0316107 A1* | 12/2011 | Tsukamoto | 257/432 |

FOREIGN PATENT DOCUMENTS

| | | |
|---|---|---|
| JP | 2002-170942 A | 6/2002 |
| JP | 2011-14673 A | 1/2011 |
| JP | 2011-077504 A | 4/2011 |

* cited by examiner

*Primary Examiner* — Steven Loke
*Assistant Examiner* — Didarul Mazumder
(74) *Attorney, Agent, or Firm* — Canon USA Inc. IP Division

(57) ABSTRACT

An insulating portion has a first region, a second region, and a third region in the stated order from the silicon portion side, the nitrogen concentration of the first region is lower than the nitrogen concentration of the second region and the oxygen concentration of the first region, the nitrogen concentration of the third region is lower than the nitrogen concentration of the second region and the oxygen concentration of the third region, and the thickness of the first region is larger than the thickness of the third region.

11 Claims, 5 Drawing Sheets

SOI SUBSTRATE, METHOD FOR MANUFACTURING SOI SUBSTRATE, AND METHOD FOR MANUFACTURING SEMICONDUCTOR DEVICE

BACKGROUND OF THE INVENTION

1. Field of the Invention

The present invention relates to an SOI substrate in which an insulating portion contains nitrogen.

2. Description of the Related Art

The use of an SOI (Silicon On Insulator) substrate in which a silicon portion where a semiconductor element is to be formed is provided on an insulating portion is effective for improving the performance of a semiconductor device. Japanese Patent Laid-Open No. 2002-170942 discloses that, due to the fact that the insulating portion contains nitrogen, the diffusion of impurities to the silicon portion can be suppressed. Japanese Patent Laid-Open No. 2011-077504 discloses introducing nitrogen into the insulating portion by plasma nitridation treatment.

However, according to former techniques, even when nitrogen is introduced, the suppression of diffusion of impurities to the silicon portion has not been sufficient.

SUMMARY OF THE INVENTION

According to this disclosure, an SOI substrate has a silicon portion, a base portion, and an insulating portion provided between the silicon portion and the base portion and containing a silicon compound, in which the insulating portion has a first region, a second region, and a third region in the stated order from the silicon portion side, the nitrogen concentration of the first region is lower than the nitrogen concentration of the second region and the oxygen concentration of the first region, the nitrogen concentration of the third region is lower than the nitrogen concentration of the second region and the oxygen concentration of the third region, and the thickness of the first region is larger than the thickness of the third region.

According to this disclosure, a method for manufacturing an SOI substrate includes heat-treating, in an oxygen containing atmosphere, an insulating film formed by subjecting a silicon oxide film on a silicon plate to plasma nitridation treatment.

According to this disclosure, a method for manufacturing a semiconductor device includes a process for forming a silicon oxide film by subjecting a silicon plate to oxidation treatment, a process for forming an insulating film by subjecting the silicon oxide film to plasma nitridation treatment, a process for heat-treating the insulating film in an oxygen containing atmosphere, a process for thinning the silicon plate, and a process for forming a semiconductor element on the silicon plate.

Further features of the present invention will become apparent from the following description of exemplary embodiments with reference to the attached drawings.

DESCRIPTION OF THE EMBODIMENTS

First Embodiment

Figure 1A:
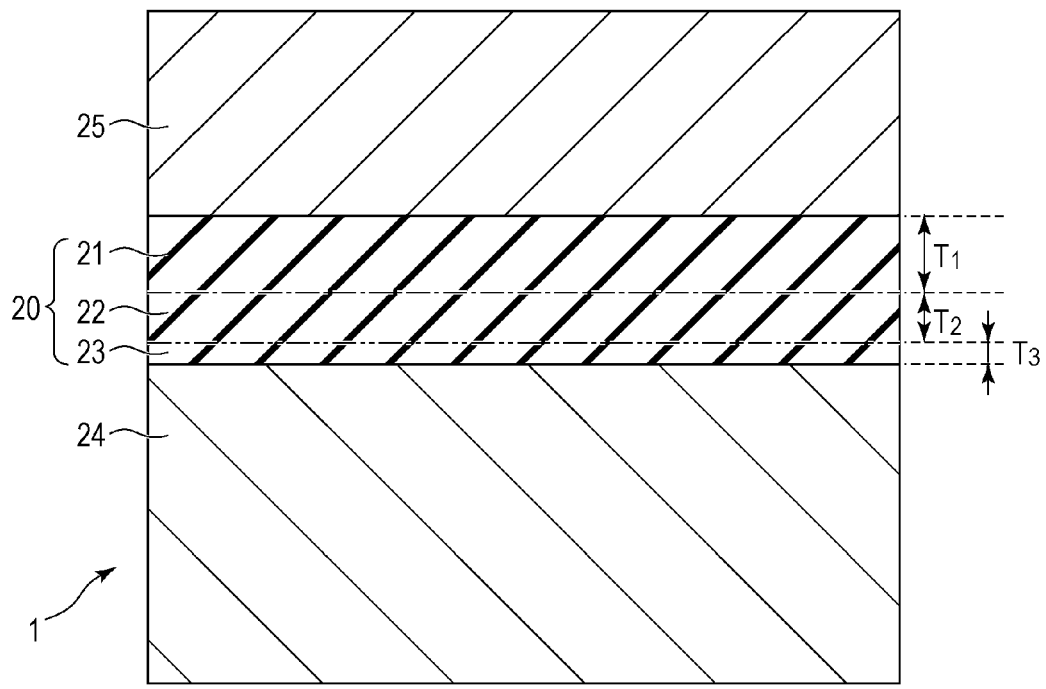
FIG. 1A is a cross-sectional schematic view of an example of an SOI substrate.

As a first embodiment, an example of the structure of an SOI substrate is described. FIG. 1A is a cross-sectional schematic view of an SOI substrate 1. The SOI substrate 1 has a silicon portion 25, an insulating portion 20, and a base portion 24. The insulating portion 20 has a first region 21, a second region 22, and a third region 23 in the stated order from the silicon portion 25 side to the base portion 24. More specifically, the first region 21 is located between the silicon portion 25 and the second region 22, the second region 22 is located between the first region 21 and the third region 23, and the third region 23 is located between the second region 22 and the base portion 24.

The silicon portion 25 contains single crystal silicon. The silicon portion 25 can contain a p-type silicon or an n-type silicon and an appropriate amount of impurities. The insulating portion 20 contains a silicon compound. Specifically, the insulating portion 20 at least contains silicon, oxygen, and nitrogen. Although the insulating portion 20 can be constituted only by the three elements, other elements, such as hydrogen, may be contained. The main material of the insulating portion 20 is silicon oxide. The nitrogen contained in the insulating portion 20 is present alone as ion or atom or present as silicon nitride or silicon oxynitride in which the nitrogen is bonded to silicon. A portion where the oxygen concentration is lower than the silicon concentration can be considered to be a silicon portion 25. Also in the silicon portion 25, a slight amount of nitrogen may be present as impurities. The base portion 24 is thicker than the silicon portion 25 and the insulating portion 20 and has a sufficient thickness (0.1 mm to 1 mm) which allows practically use of the SOI substrate in the manufacturing of a semiconductor device. The base portion 24 contains a conductor, such as metal, an insulator, such as glass, or a semiconductor, such as silicon. When reducing the stress generated in the SOI substrate, it is desirable to constitute the base portion 24 with single crystal silicon.

Figure 1B:
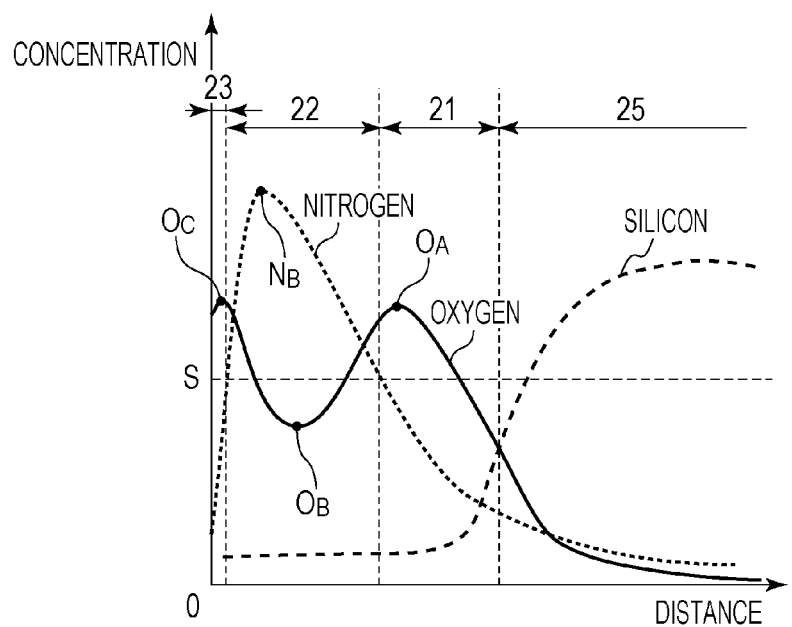
FIG. 1B illustrates an example of the concentration distributions of an SOI substrate.

In this embodiment, the concentration distributions of oxygen and nitrogen in the insulating portion 20 are particularly important. FIG. 1B illustrates an example of the concentration distributions of the constituent elements in the insulating portion 20 and the silicon portion 25, in which the silicon is represented by the dashed line, the oxygen is represented by the solid line, the nitrogen is represented by the dotted line. The horizontal axis of FIG. 1B represents the distance from the reference surface, which is the interface between the insulating portion 20 and the base portion 24, in the direction from (the thickness direction of the SOI substrate) from the base portion 24 to the silicon portion 25. The vertical axis of FIG. 1B represents the concentration of each atom. Although FIG. 1B shows differences (high or low) in the concentrations of atoms of different species at arbitrary positions from the reference surface, the concentration is not always shown in terms of the ratio according to the scale of the vertical axis. For example, even when the concentrations of the atoms of different species at an arbitrary position are half in the graph, the concentrations are not always half in fact.

As illustrated in FIG. 1B, both the nitrogen concentration and the oxygen concentration sharply change near the boundary between the insulating portion 20 and the silicon portion 25 and the concentrations of the nitrogen and the oxygen in the silicon portion 25 are lower than the concentrations of the nitrogen and the oxygen in the insulating portion 20. The silicon concentration also sharply changes near the boundary between the insulating portion 20 and the silicon portion 25 and the silicon concentration in the insulating portion 20 is lower than the silicon concentration in the silicon portion 25. Macroscopically, the concentration of each element sharply changes but the first region 21 is continuous to the silicon portion 25, and thus, microscopically, the concentration distributions continuously change.

The first region 21, the second region 22, and the third region 23 described above may be specified by the nitrogen concentration distribution in addition to the positional relationship to the silicon portion 25. The nitrogen concentration distribution shows one maximum value in the thickness direction. The position where the nitrogen concentration distribution shows the maximum value is included in the second region 22. As illustrated in FIG. 1B, the nitrogen concentration is lower than a predetermined value S in the first region 21. In the second region 22, the nitrogen concentration is equal to or higher than the predetermined value S. In the third region 23, the nitrogen concentration is lower than the predetermined value S. More specifically, the nitrogen concentration of the first region 21 and the nitrogen concentration of the third region 23 are lower than the nitrogen concentration of the second region 22. The nitrogen concentrations at the boundary between the first region 21 and the second region 22 and at the boundary between the second region 22 and the third region 23 are equal to the predetermined value S. These boundaries are conveniently included in the second region 22. Typically, the maximum value of the nitrogen concentration distribution in the second region 22 shows the maximum value of the nitrogen concentration in the insulating portion 20. Nitrogen may not be present in the first region 21 and the third region 23. However, the nitrogen in the second region 22 may be diffused to the first region 21 and the third region 23, and therefore, typically, nitrogen whose amount is smaller than the amount of the nitrogen in the second region 22 is present in the first region 21 and the third region 23.

The oxygen concentration distribution of this example shows two maximum values $O_A$ and $O_C$ in the thickness direction and shows one minimum value $O_B$ between the values. The maximum value is a value from which the concentration changes from an increase tendency to a reduction tendency. The minimum value is a value from which the concentration changes from a reduction tendency to an increase tendency. The position at which one maximum value (the first maximum value) $O_A$ of the oxygen concentration distribution is shown is included in the first region 21 and the position at which the other maximum value (the second maximum value) $O_C$ of the oxygen concentration distribution is shown is included in the third region 23. The position at which the minimum value $O_B$ of the oxygen concentration distribution is shown is included in the second region 22. The oxygen concentration distribution may not have at least one of the maximum value and the minimum value. For example, the oxygen concentration may monotonously decrease or increase from one end to the other end of the insulating portion 20. A case is considered where the maximum value $O_C$ of the oxygen concentration distribution is not present in the third region 23 and the oxygen concentration monotonously increases from the minimum value $O_B$ of the oxygen concentration distribution present in the second region 22 to the surface at the third region 23 side of the insulating portion 20. Not the first region 21 and the third region 23 but the second region 22 may show the maximum value of the oxygen concentration distribution. Not the second region 22 but the first region 21 and the third region 23 may show the maximum value of the oxygen concentration distribution.

In the first region 21, the oxygen concentration is higher than the nitrogen concentration. Also in the third region 23, the oxygen concentration is higher than the nitrogen concentration. The second region 22 may have at least one of a portion where the nitrogen concentration is higher than the oxygen concentration and a portion where the oxygen concentration is higher than the nitrogen concentration. In this example, a portion where the oxygen concentration is higher than the nitrogen concentration is located at both sides of a portion where the nitrogen concentration is higher than the oxygen concentration in the second region 22. Although it is suitable that the maximum value $N_B$ of the nitrogen concentration distribution is larger than the minimum value $O_B$ of the oxygen concentration distribution, the maximum value $N_B$ may be equal to or lower than the minimum value $O_B$ of the oxygen concentration distribution.

In this example, the nitrogen concentration at the position where the oxygen concentration distribution shows the first maximum value $O_A$ is lower than the first maximum value $O_A$ of the oxygen concentration distribution. The oxygen concentration at the position where the nitrogen concentration distribution shows the maximum value $N_B$ is lower than the maximum value $N_B$ of the nitrogen concentration. The nitrogen concentration at the position where the oxygen concentration distribution shows the second maximum value $O_C$ is lower than the second maximum value $O_C$ of the oxygen concentration distribution. It is suitable for suppressing the diffusion of impurities that the maximum value of the nitrogen concentration is sufficiently high. The maximum value of the nitrogen concentration distribution may be lower than at least one of the maximum values of the oxygen concentration distribution. However, as in this example, the maximum value $N_B$ of the nitrogen concentration distribution is suitably higher than both the two maximum values $O_A$ and $O_C$ of the oxygen concentration distribution. The predetermined value S described above is suitably set in such a manner as to be larger than the smallest value of the oxygen concentration or the minimum value $O_B$ of the oxygen concentration distribution in the insulating portion 20. The predetermined value S is practically 1 at % or more. The maximum value of the typical nitrogen concentration distribution is 2 at % or more and 30 at % or lower. It is desirable that, in the nitrogen concentration distribution, the maximum value of the nitrogen concentration of the insulating portion 20 is equal to the maximum value of the nitrogen concentration of the insulating portion 20.

The nitrogen present in the insulating portion 20 is effective for suppressing the diffusion of impurities to the silicon portion 25. The impurities are metallic elements or metalloid elements which are mainly present in the base portion 24. In particular, boron is likely to diffuse and has considerable influence on the operation of a semiconductor device. Nitrogen can reduce the diffusion of boron. When the base portion 24 contains silicon containing boron as impurities, it can be said that this embodiment is particularly suitable. The silicon containing boron is not limited to p-type silicon and may be an n-type silicon depending on the donor amount.

As described above, nitrogen which suppresses the diffusion of impurities is mainly contained in the second region 22, so that the second region 22 functions as a region for suppressing the diffusion of impurities. Herein, the first region 21 located at the silicon portion 25 side relative to the second region 22 may function as a buffer region which suppresses the influence of the nitrogen in the second region 22 on the silicon portion 25. This is because the affinity of oxygen to the silicon portion 25 is higher than that of nitrogen. As one of the influences of nitrogen on the silicon portion 25, the generation of levels in the energy gap at the surface of the silicon portion 25 (interface between the silicon portion 25 and the insulating portion 20) is mentioned. Such levels may cause random noise, such as a 1/f noise, in a transistor to be formed in the silicon portion 25.

Figure 5A:
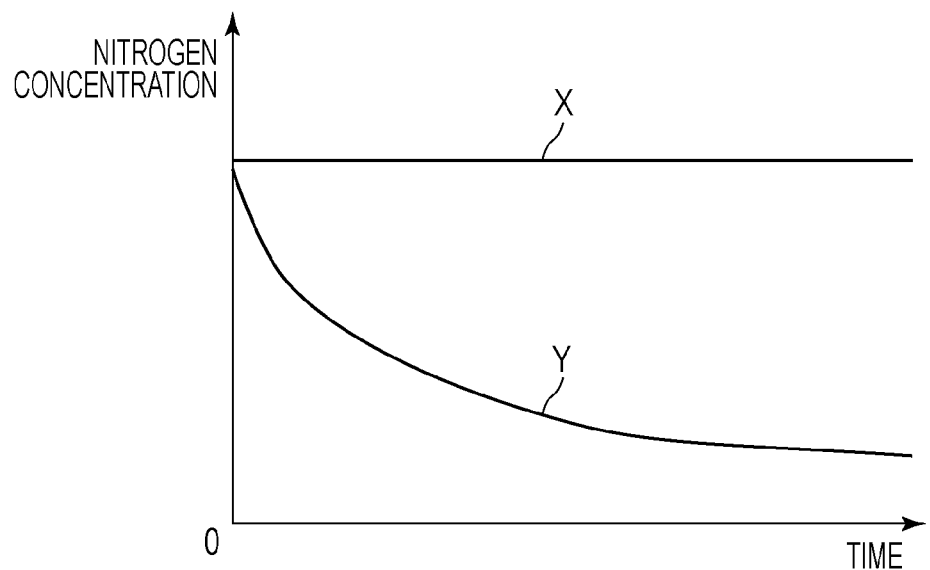
FIG. 5A is an example of changes in the nitrogen concentrations of an SOI substrate.

The third region 23 may function as an auxiliary region of the second region 22. The line X represents changes in the nitrogen concentration when the third region 23 is provided. FIG. 5A shows the change with time of the nitrogen concentration of the insulating portion 20. The line Y represents changes in the nitrogen concentration when the third region 23 is not provided. As is clear from FIG. 5A, the line Y represents that the nitrogen concentration clearly decreases. The line X represents that the nitrogen concentration gradually decreases. More specifically, the reduction in the nitrogen concentration is suppressed by providing the third region 23. Although it is considered that the concentration changes with time herein, it is found that the heating of the SOI substrate inevitably performed in manufacturing of a semiconductor device causes a reduction in the nitrogen concentration similarly as the change with time. A case is imagined where a semiconductor device is manufactured using an SOI substrate in which the nitrogen concentration of the insulating portion 20 considerably decreases due to the change with time or a case is imagined where the nitrogen concentration of the insulating portion 20 considerably decreases in a manufacturing process of a semiconductor device. Thus, when the nitrogen concentration of the insulating portion 20 is low, the insulating portion 20 cannot sufficiently suppress the diffusion of impurities, so that a desired performance of a semiconductor device may not be obtained. By disposing the third region 23 containing a relatively large amount of oxygen at the side opposite to the silicon portion 25 of the second region 22 containing a relatively large amount of nitrogen, such a reduction in the performance of a semiconductor device can be suppressed. The "region containing a relatively large amount of nitrogen" means a region where the content of nitrogen is higher than the content of oxygen or a region where the nitrogen concentration is higher than the oxygen concentration of other regions. The "region containing a relatively large amount of oxygen" means a region where the content of oxygen is higher than the content of nitrogen or a region where the oxygen concentration is higher than the nitrogen concentration of other regions.

The thickness of the insulating portion 20 can be arbitrarily set and, for example, can be set to a thickness of 1 nm or more and 1000 nm or lower. When the thickness of the insulating portion 20 is larger, the suppression of diffusion of the impurities to the silicon portion 25 becomes easy. However, a thick insulating portion 20 may cause a problem of a stress of an SOI substrate. When using the insulating portion 20 as a gate insulating film of a back gate, the thickness of the insulating portion 20 is suitably set to be at least lower than 50 nm and more suitably 10 nm or lower. According to the configuration of this embodiment, even when the thickness of the insulation portion 20 is lower than 50 nm, the diffusion of impurities can be suppressed. Although the details are described later, according to this embodiment, even when the thickness of the insulating portion 20 is 2 to 10 nm, a high-performance image pickup apparatus can be manufactured. In particular, since the influence of impurities obviously appears in the performance as image quality in the image pickup apparatus as compared with semiconductor devices, such as a memory storage and an arithmetic unit, the control of impurities is important.

When the ratio (thickness) of the first region to the third region occupying the insulating portion 20 can be set as appropriate. The thickness $T_1$ of the first region 21 is larger than a thickness $T_3$ of the third region 23. In other words, the second region 22 is suitably located at a position closer to the base portion 24 relative to the silicon portion 25. Thus, the influence of the nitrogen in the second region 22 on the silicon portion 25 can be reduced. The third region 23 is not required to be thick. Typically, the thickness of the third region 23 is smaller than the total of the thickness of the first region 21 and the thickness of the second region 22 ($T_3<T_1+T_2$). More typically, the thickness $T_3$ of the third region 23 is smaller than each of the thickness of the first region 21 and the thickness of the second region 22. For example, the thickness $T_3$ of the third region 23 is lower than 5 nm and the thickness $T_2$ of the second region 22 is 10 nm or lower. The thickness $T_3$ of the third region 23 may be 1 nm or lower. The thickness $T_2$ of the second region 22 is suitably larger than the thickness $T_1$ of the first region 21. This is because when the thickness $T_2$ of the second region 22 is extremely small, impurities may easily pass through the second region 22. However, when the insulating portion 20 is thick (for example, 50 nm or more), the thickness $T_2$ of the second region 22 can also be made smaller than the thickness $T_1$ of the first region 21. Thus, the influence of the nitrogen on the silicon portion 25 can be reduced.

As described above, the SOI substrate 1 of this embodiment can suppress the diffusion of impurities to the silicon portion 25. The use of the SOI substrate 1 allows manufacturing of a high-performance semiconductor device.

Second Embodiment

As a second embodiment, an example of a method for manufacturing an SOI substrate is described. FIGS. 2A to 2F are views illustrating a method for manufacturing a semiconductor device according to this example in order of processes. The manufacturing method is described with reference to the description of the first embodiment.

Process A

Figure 2A:
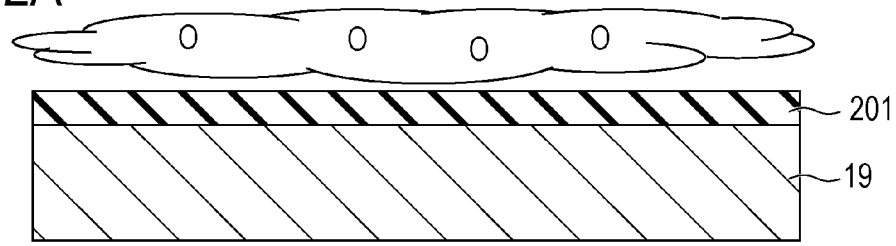
FIGS. 2A to 2E are cross-sectional schematic views of an example of a method for manufacturing an SOI substrate.

As illustrated in FIG. 2A, in a process A, a silicon plate 19 containing single crystal silicon, at least one portion of which serves as a silicon portion 25 of an SOI substrate, is prepared, and then the surface of the silicon plate 19 is subjected to oxidation treatment. By the oxidation treatment, an insulating film 201 which is a silicon oxide film serving as a base material of an insulating portion 20 is formed on the silicon plate 19.

As the silicon plate 19, a common silicon wafer can be used. The diameter, the thickness, the impurity density, the conductivity type, and the like of the silicon plate 19 can take various specifications according to the purpose.

Although the formation of the silicon oxide film may be achieved by natural oxidation in which the silicon plate 19 is allowed to stand still in the atmosphere of normal temperature and normal pressure, it is suitable to achieve the formation by subjecting the silicon plate 19 to oxidation treatment, i.e., not by natural oxidation but by artificial oxidation treatment. When a natural oxide film is formed on the silicon wafer, the natural oxide film may be removed before performing the oxidation treatment. When the oxidation treatment is employed, a uniform silicon oxide film whose composition is close to the stoichiometric composition as compared with the natural oxide film can be obtained. As the oxidation treatment, thermal oxidation treatment is suitable but radical oxidation treatment, plasma oxidation treatment, CVD treatment in reduced pressure, and the like can be employed.

In this embodiment, a silicon oxide film having a thickness of 2 to 10 nm is formed by thermal oxidation treatment in normal pressure. As the thermal oxidation conditions in this case, the thermal oxidation can be performed at a temperature of 700 to 1200° C. in oxygen or in a mixed gas containing hydrogen and oxygen. In this case, although the silicon oxide film is formed at both sides of the silicon plate 19, a description of the silicon oxide film at the rear side which is not directly related to this embodiment is omitted.

Figure 2B:
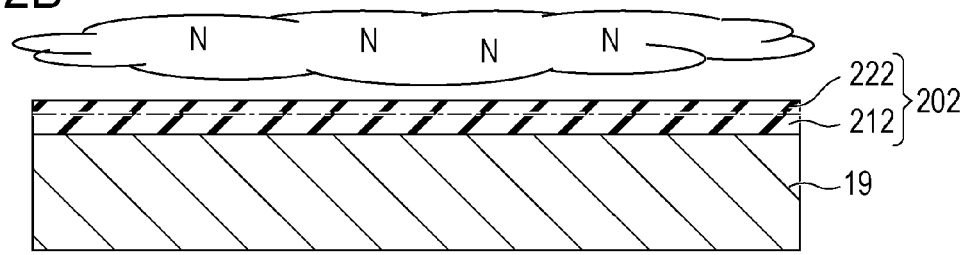

In a process B illustrated in FIG. 2B, a region containing nitrogen is formed in the insulating film 201 by subjecting the surface of the insulating film 201 to plasma nitridation treatment. By the plasma nitridation treatment, an insulating film 202 having a first region 212 serving as a forerunner of a first region 21 and a second region 222 serving as a forerunner of the second region 22 is formed. It may be configured so that, in the first region 212, the oxygen concentration is higher than the nitrogen concentration and, in the second region 222, the nitrogen concentration is higher than the oxygen concentration.

The plasma nitridation can be performed under the conditions of a temperature of 250 to 500° C., a pressure of 6.7 to 1000 Pa, an RF output of 800 to 4000 W, and argon of 500 to 2000 sccm, and nitrogen of 150 to 200 sccm. Under the conditions, the insulating film 202 can be obtained in which the maximum value (highest value) of the nitrogen concentration distribution is 2 at % or more and 30 at % or lower. As a power supply for generating plasma, not microwaves but a 13.56 MHz high frequency power supply can be used. As the plasma nitridation conditions in this case, when using nitrogen in inductively coupled plasma (ICP), a silicon nitride layer of the same nitrogen concentration can be obtained in the range of a temperature of 10 to 100° C., a pressure of 0.6 to 66.7 Pa, and an RF output of 200 2000 W. When using ammonia in ICP, the treatment can be performed in the range of a temperature of 400 to 600° C., a pressure of 0.6 to 66.7 Pa, and an RF output of 200 to 800 W. In addition thereto, when using magnetron plasma (MMT) as the plasma source, the treatment can be performed in the range of a temperature of 25 to 650° C., a pressure of 1.0 to 133.3 Pa, and an RF output of 150 to 400 W.

For example, by performing plasma nitridation treatment by microwaves, the highest nitrogen concentration of the insulating film 202 can be set to 18 at %. The plasma nitridation treatment conditions in this case are as follows: a temperature of 400° C., a pressure of 40 Pa, an RF frequency of 2.45 GHz, an RF output of 1800 W, a mixed gas containing 750 sccm argon and 150 sccm nitrogen, and a time of 110 sec.

Figure 2C:
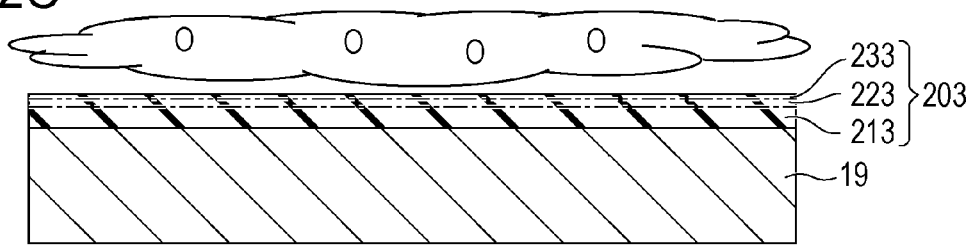

In a process C illustrated in FIG. 2C, the insulating film 202 is heat-treated in an oxygen containing atmosphere. By the heat treatment, the oxygen concentration distribution and the nitrogen concentration distribution are varied from those of the insulating film 202. During the heat treatment, at least any one of the oxidization of the surface of the insulating film 202, the aggregation of oxygen in the insulating film 202 to the vicinity of the surface of the insulating film 202, the diffusion of nitrogen in the vicinity of the surface of the insulating film 202 from the surface of the insulating film 202, and the like occurs. Typically, at least the oxidization of the surface of the insulating film 202 occurs. By the treatment, an insulating film 203 is formed which has substantially the same structure as that of the insulating portion 20 of FIG. 1A. More specifically, the insulating film 203 has a first region 213 substantially the same as the first region 21, a second region 22 substantially the same as the second equal region 223, and a third region 233 sequentially the same as the third region 23 in the stated order from the silicon plate 19 side. At this time, the insulating film 203 is exposed to the atmosphere.

As the heat treatment in the oxygen containing atmosphere, by performing dry oxidation treatment under reduced pressure, for example, to form the third region 233 having a thickness of 1 nm or lower at the surface side of the insulating film 202, the insulating film 203 is formed. The heat treatment conditions in this case are a temperature of 1100° C., a pressure of 133 Pa, oxygen of 3000 sccm, and a time of 10 sec. The heat treatment conditions in the oxygen containing atmosphere are in the range of a temperature of 500 to 1200° C., a pressure of 26.7 to 667 Pa, and a time of 5 to 60 sec. As the atmosphere during the heat treatment, the heat treatment can be performed not only in an atmosphere containing only oxygen but in an atmosphere containing any gas, hydrogen, nitrogen, or helium therein. The same heat treatment under normal pressure can also be applied.

In this process, oxidization may occur at both sides of the insulating film 203 depending on the thickness and the heat treatment condition of the insulating film 203. More specifically, oxidization may occur not only on the surface of the insulating film 203 (surface of the second region 222) but between the second region 222 and the silicon plate 19, particularly between the first region 212 and the silicon plate 19. However, the oxidization degree is different between in a region where the content of oxygen is higher than the content of nitrogen and in a region where the content of nitrogen is higher than the content of oxygen. The oxidation in the region where the content of nitrogen is higher than the content of oxygen is more dominant than the oxidation in the region where the content of oxygen is higher than the content of nitrogen. By the second region 222 formed by the plasma nitridation treatment, the nitrogen concentration is higher at the surface side than that of the silicon plate 19 side of the insulating film 202. Therefore, in this process, the third region 233 where the oxygen concentration is high can be formed at the surface side of the insulating film 203.

Figure 2D:
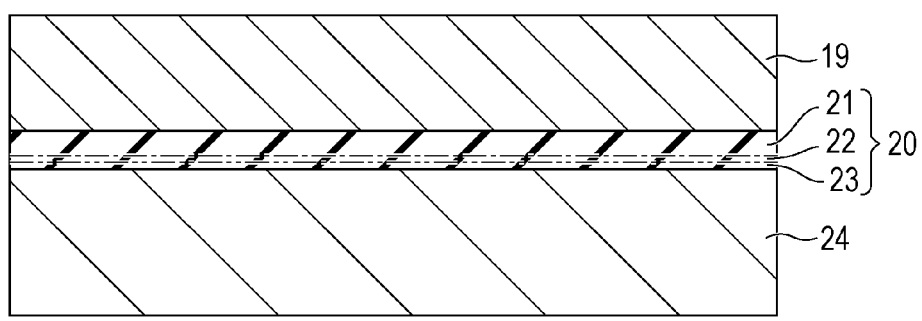

In a process D illustrated in FIG. 2D, the prepared base member and the silicon plate 19 are bonded to each other through the insulating film 203, and then joined. The base member constitutes the base portion 24 of an SOI substrate. The base member is an insulator, a conductor, or a semiconductor and silicon plates, such as a commercially-available silicon wafer, are suitable. This embodiment is suitable when the base member is a silicon plate containing boron, for example, the base member is a p-type silicon wafer.

In the process D, two silicon plates (the silicon plate 19 and the base member) are superimposed on each other in the atmosphere in a clean room of normal temperature and normal pressure, for example. Thereafter, heat treatment at a temperature of 900 to 1300° C. for 30 to 180 min is performed, and then bonding by drying condensation can be performed. In addition thereto, it is possible to employ a known substrate bonding technique in an SOI substrate manufacturing technique.

In connection with the bonding of the base member, the impurities of the base portion 24 may be diffused to the silicon portion 25. However, as described above, the diffusion of the impurities to the first region 21 and the silicon portion 25 is suppressed by the insulating portion 20 formed by the insulating film 203, particularly the second region 22. On and after this process, the impurities diffused from the base portion 24 may be present in the second region 22 and in the third region 23.

Figure 2E:
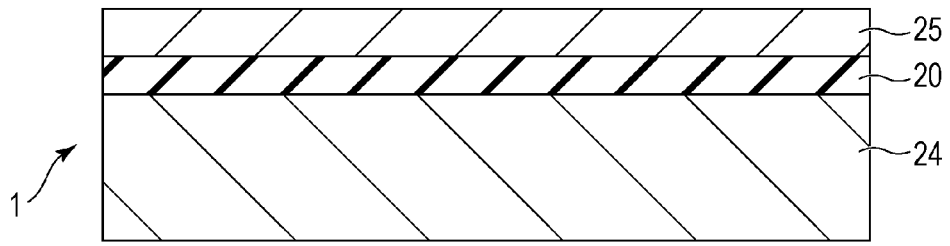

In a process E illustrated in FIG. 2E, the silicon portion 25 as one part of the silicon plate 19 is formed on the insulating portion 20 by subjecting the silicon plate 19 to thinning treatment. Herein, a known thinning technique can be used. For example, first, a first thinning treatment by grinding with a grinder, ELID (ElectroLytic In-process Dressing), or the like is performed. Thereafter, a second thinning treatment for thinning the silicon plate 19 until a desired thickness is achieved by techniques, such as CMP (Chemical Mechanical Polishing) or PACE (Plasma Assist Chemical Etching). Furthermore, it is possible to perform a third thinning treatment which finishes the surface into a flat surface by wrapping, light etching, or the like. In addition thereto, SmartCut in which a release layer or a selective etching layer is provided on the silicon plate 19 can be employed as the thinning method. It is also possible to apply ELTRAN (Epitaxial Layer TRANsfer) using the silicon plate 19 in which an epitaxial single crystal silicon layer is formed on a porous silicon layer.

The SOI substrate 1 can be manufactured as described above.

In the above-described manufacturing method, when the reduction in the nitrogen concentration illustrated in FIG. 5A is extensively examined, it is found that the nitrogen concentration is likely to decrease between the process B and the process C. When a specific example of FIG. 5A is given, the reduction amount of the nitrogen concentration when 8 hours passed after the plasma nitridation was 0.3% or lower in one which was heat treated in the oxygen containing atmosphere but was 5% or more in one which was not heat treated. Herein, the concentration distribution of each atom in the thickness direction of the SOI substrate 1 in the state after the process B and before the process C is described with reference to FIG. 5B. The vertical axis and the horizontal axis of FIG. 5B are the same as those of the vertical axis and the horizontal axis of the graph of the concentration distributions illustrated in FIG. 1B.

Figure 5B:
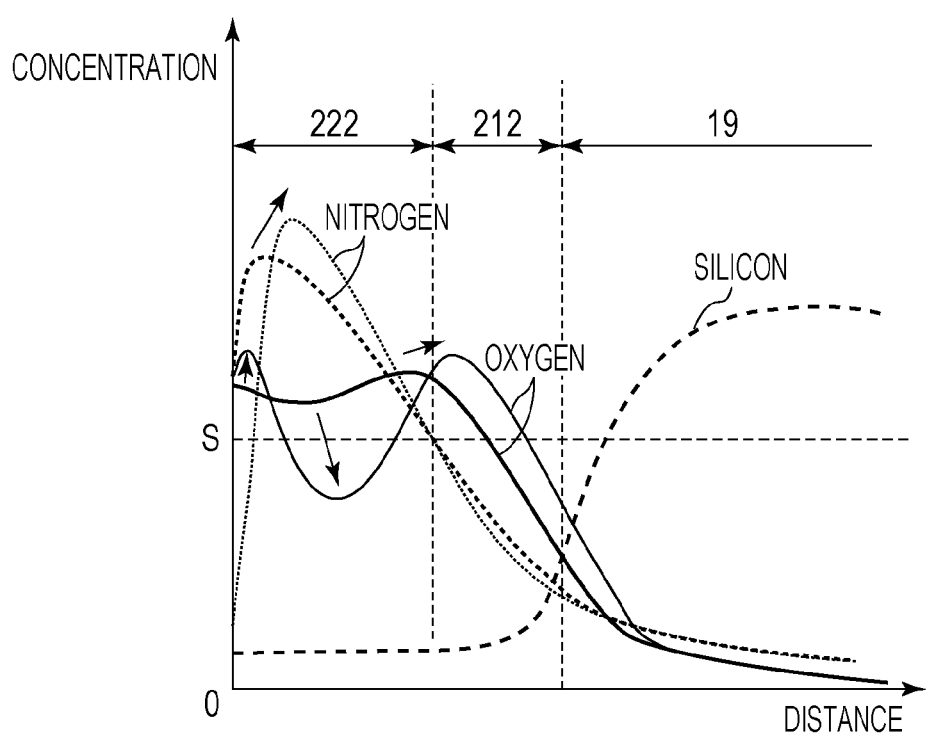
FIG. 5B is an example of the concentration distributions of an SOI substrate.

In FIG. 5B, as an example of the concentration distributions of the constituent elements in the insulating portion 20 and the silicon portion 25, silicon is represented by the dashed line, oxygen is represented by the solid line, and nitrogen is represented by the dotted line. About each of the dashed line, the solid line, and the dotted line, the thick line represents the state after the process B and before the process C and the thin line represents the state after the process C. The concentration distributions illustrated in FIG. 1B are almost the same as those of the state after the process C.

More specifically, the nitrogen concentration distribution and the oxygen concentration distribution change from one represented by the thin line to one represented by the thick line before and after the process C. Before the process C, the maximum value of the nitrogen concentration distribution appears in the second region 222 as represented by the thick dotted line. As represented by the thick solid line, the maximum value of the oxygen concentration distribution appears in the first region 212. When passing through the heat treatment in the process C, the maximum value of the oxygen concentration distribution moves to the silicon plate 19 side, and shows the first maximum value. Then, the maximum value of the nitrogen concentration distribution also moves to the silicon plate 19 side. Then, the second maximum value of the oxygen concentration distribution appears between a region where the nitrogen concentration distribution reaches a new maximum value and the surface. This portion serves as the third region 233. When considering the position of the minimum value of the oxygen concentration distribution, it can be assumed that the oxygen present in the second region 222 is separately diffused to each of the first region 21 and the third region 23.

When subjecting the insulating film 201 which is a silicon oxide film to plasma nitridation, silicon nitride is formed in the insulating film 201. Herein, since the silicon oxide is subjected to plasma nitridation, it is considered that the oxygen atom on the surface of the silicon oxide is replaced by the nitrogen atom to thereby form silicon nitride. In this case, the maximum value of the nitrogen concentration distribution is located near the surface (the second region 222) of the insulating film 202. However, the silicon-nitrogen bonding strength is weak as compared with the silicon-oxygen bonding strength. Therefore, in the state as it is, the nitrogen atoms are separated from the silicon nitride located near the surface of the insulating film 202 with the passage of time and diffused into the atmosphere, so that nitrogen is lost from the insulating film 202. FIG. 5A shows the state.

In this embodiment, the surface of the insulating film 202 contains silicon nitride and the inside thereof contains silicon oxide. Therefore, when the insulating film 203 is heat treated in the oxygen containing atmosphere, the silicon and the oxygen in the atmosphere are bonded on the surface of the insulating film 202, so that another silicon oxide is formed. It is considered that this phenomenon forms the third region 233.

Since the silicon-oxygen bonding strength is high, the third region 233 containing silicon oxides in a high proportion formed near the surface of the insulating film 203 can suppress the separation of the nitrogen atoms from the second region 223. Thus, the reduction in the nitrogen concentration of the insulating film 203 is suppressed.

In the process B of this embodiment, even when the silicon oxide is heat-treated in the gas containing nitrogen atoms, such as nitrogen monoxide, nitrous oxide, and ammonia (thermal nitridation treatment), silicon nitride can be formed in the silicon oxide. The insulating film 202 in this case shows a nitrogen concentration distribution having the maximum value near the interface between the silicon plate 19 and the silicon oxide. As compared with the plasma nitridation treatment in which the introduction of nitrogen by the plasma diffusion reaction at a low temperature of 400° C. or lower occurs, a heat reaction at a high temperature of about 1200° C. occurs in the thermal nitridation treatment. Therefore, it is imagined that even when the nitride layer forms the surface, the nitrogen atoms are difficult to separate. Therefore, it can be said that the separation of nitrogen notably occurs in the plasma nitridation treatment as compared with the thermal nitridation treatment. As described above, damages to the silicon portion 25 are smaller in the plasma nitridation treatment than in the thermal nitridation treatment. Therefore, by employing the heat treatment for forming the third region 233 and the thermal nitridation treatment in combination, an extremely highly-reliable SOI substrate can be obtained.

Third Embodiment

A third embodiment describes an example of a method for manufacturing a semiconductor device using the SOI substrate described in the first embodiment and the second embodiment. Herein, the description is given taking, as an example, an image pickup apparatus in which the influence of impurities notably appears in the performance as described above. In a so-called backside illumination type image pickup apparatus among the image pickup apparatuses, there is a necessity of thinning silicon serving as a photoelectric conversion portion to 10 μm or lower. By the use of the SOI substrate 1 having the thin silicon portion 25, the thinning process of silicon can be simplified or omitted. Hereinafter, a method for manufacturing a backside illumination type image pickup apparatus (CMOS image sensor) is described.

Figure 3F:
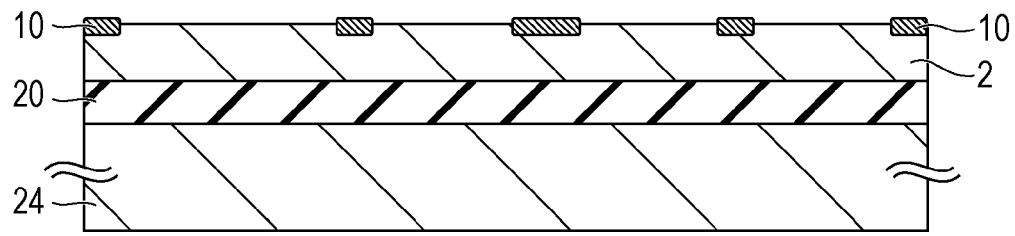
FIGS. 3F to 3H are schematic views of an example of the method for manufacturing a semiconductor device.

In a process F illustrated in FIG. 3F, the silicon portion 25 of the SOI substrate 1 described with reference to FIG. 1A is used as the element formation portion 2 and the process includes forming element isolation portions 10 on the element formation portion 2. Herein, each element is insulated and isolated by a known element isolation method, such as a selective oxidation method (LOCOS: LOCal Oxidation of Silicon) or STI (Shallow Trench Isolation), for example. In addition thereto, EDI (Expanding photodiode area Designed for Isolation) or a technique of providing a semiconductor region serving as a barrier to electric charges by an impurity diffusion layer for isolating each element can also be applied.

Figure 3G:
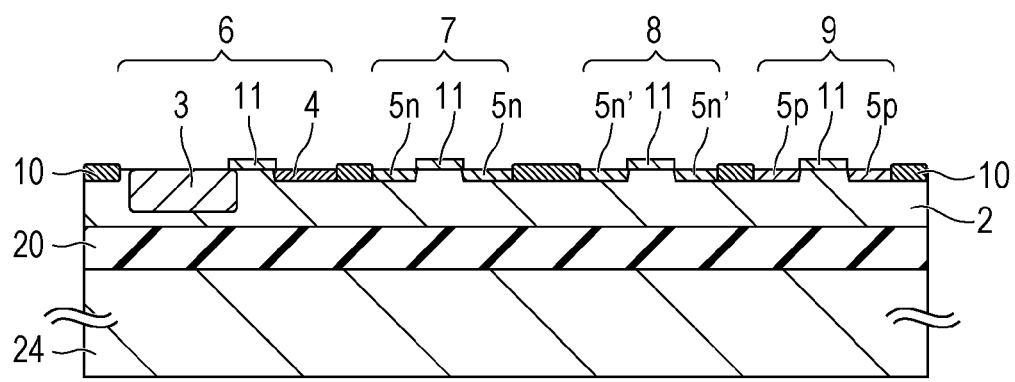

A process G illustrated in FIG. 3G includes forming semiconductor elements on the element formation portion 2. Each semiconductor element can be formed by a known semiconductor process. FIG. 3G illustrates a transfer transistor 6 which is an NMOSFET, an amplification transistor 7, and a transistor 8 of a peripheral circuit, and also illustrates a transistor 9 of a peripheral circuit which is a PMOSFET. On the element formation portion 2, gate electrodes 11 are formed through a gate insulating film which is not illustrated. The transfer transistor 6 contains a photodiode 3 (photoelectric conversion element) as the source and a floating diffusion 4 as the drain. The amplification transistor 7 has an n-type source/drain 5n, the transistor 8 has an n-type source/drain 5n', and the transistor 9 has a p-type source/drain 5p. In the element formation portion 2, a plurality of impurity diffusion regions forming a well region, an LDD region, a HALO region, a channel stop region, and the like are formed in addition thereto, but the description thereof is omitted.

Figure 3H:
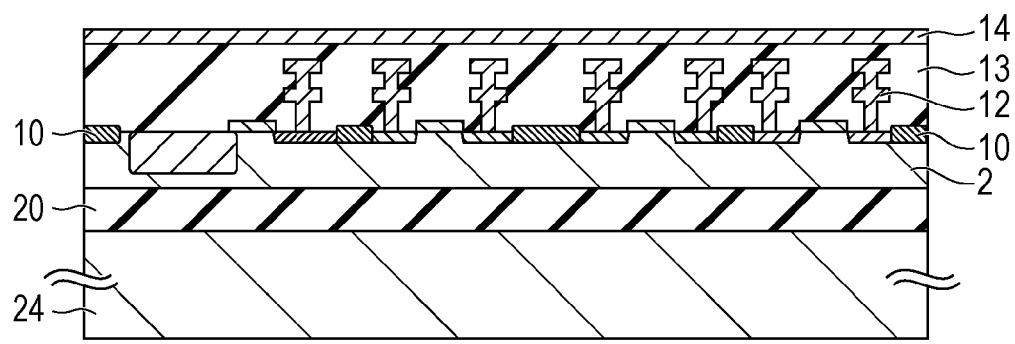

In a process H illustrated in FIG. 3H, a wiring structure is formed on the element formation portion 2. The wiring structure can be formed by a known semiconductor process. FIG. 3H illustrates metal wirings 12 each containing a contact plug, a wiring layer, a via plug, and the like and an interlayer insulation film 13 which insulates the metal wirings. A passivation film 14 for protecting the semiconductor elements and the wiring structures is formed. The metal wiring 12 is formed using a copper wiring technique or an aluminum wiring technique.

Figure 4I:
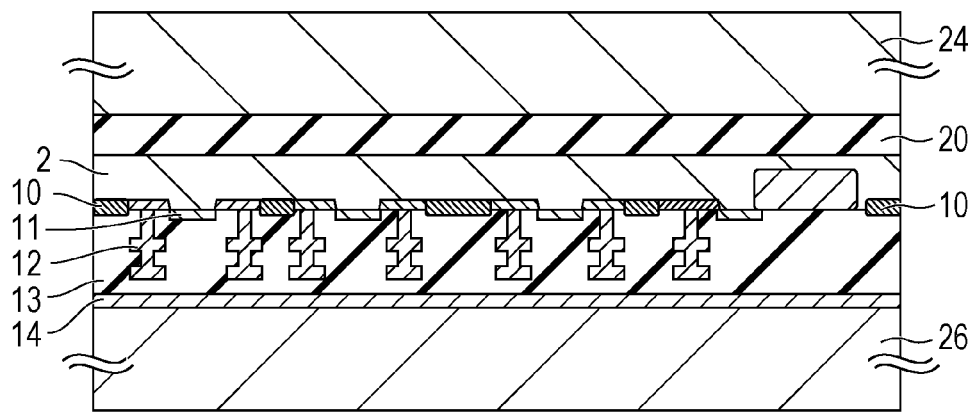
FIGS. 4I to 4K are schematic views of an example of the method for manufacturing a semiconductor device.

In a process I illustrated in FIG. 4I, a support substrate 26 is disposed the side opposite to the base portion 24 of the SOI substrate and the element formation portion 2 and the support substrate 26 are bonded to each other with the wiring structure interposed therebetween.

Figure 4J:
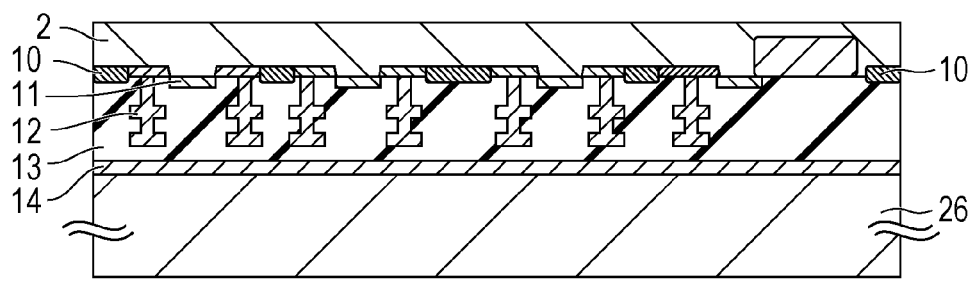

In a process J illustrated in FIG. 4J, the base portion 24 is removed. Herein, a known substrate thinning technique employed in three-dimensional mounting, a TSV (Through Silicon Via) formation process, and the like can be applied. For example, after grinding the base portion 24 with a grinder, the base portion 24 is thinned by CMP until the insulating portion 20 is exposed. Then, the remaining base portion 24 can be removed with a mixed liquid (fluonitric acid) containing fluoric acid and nitric acid or the like. Next, the insulating portion 20 is removed. Herein, the selective removal of the insulating portion 20 can be achieved by wet etching with an aqueous solution containing fluoric acid, dry etching with gas containing anhydrous hydrofluoric acid, plasma etching in the atmosphere containing chlorofluorocarbon, such as tetrafluoromethane or trifluoromethane, or the like.

The insulating portion 20 has a structure having the first region 21, the second region 22, and the third region 23. As described above, the reaction to chemicals or gas can be handled similarly as silicon oxide. This is because the effective thickness of the second region 22 is about several nanometers and the volume occupation ratio of the nitrogen to the entire insulating portion 20 is several percent or lower, and therefore the insulating portion 20 can be handled substantially as silicon oxide. The insulating portion 20 can be used as a part of an image pickup apparatus. For example, the third region 23 is removed following the removal of the base portion 24, and then the second region 22 and the first region 21 can be made to remain on the silicon portion 25. Or, the third region 23 and the second region 22 are removed following the removal of the base portion 24, and then the first region 21 can be made to remain on the silicon portion 25. Thus, by making one part of the insulating portion 20, at least the first region 21, remain, the silicon portion 25 is not exposed, so that the defects of the silicon portion 25, particularly noise generated in the semiconductor device, can be reduced. The impurities diffused from the base portion 24 may exist in the third region 23. Therefore, in order to reduce the influence of the impurities, it is suitable to remove at least the third region 23.

Figure 4K:
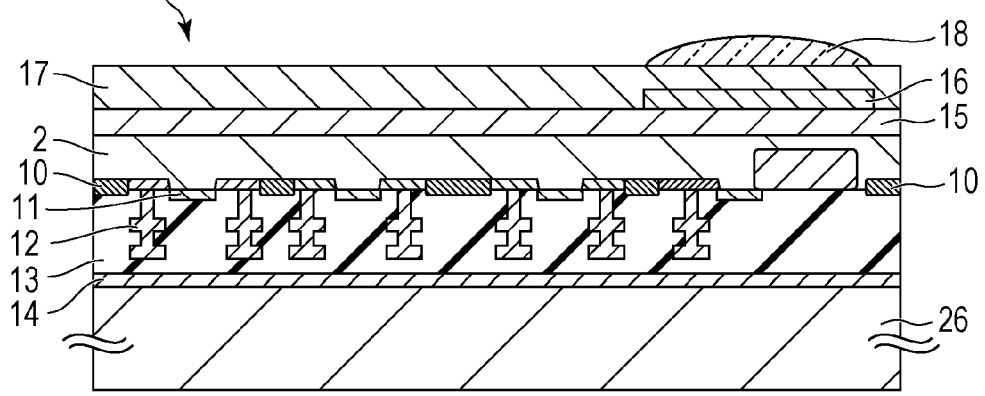

In a process K illustrated in FIG. 4K, a light transmissive intermediate film 15, a color filter 16, a capping film 17, a microlens 18, and the like are formed on the element formation portion 2. At least any one of these members can be omitted. Herein, a known color filter formation process and a microlens formation process can be employed. When making at least one part of the insulating portion 20 remain on the silicon portion 25 as described above, the color filter and the microlens are formed on the remaining one part of the insulating portion 20. The support substrate 26 is separated after this process or can also be used in the following mounting process. The support substrate 26 can be subjected to thinning treatment (back grind).

As described above, a semiconductor device 100 as a backside illumination type image pickup apparatus can be obtained.

In this embodiment, a uniform element formation portion 2 with high precision is obtained, and therefore an image pickup apparatus which hardly causes variation of the optical characteristics and the like, can be provided at a high yield. In a backside illumination type solid image pickup apparatus, the photodiode 3 is disposed contacting or to the very vicinity of the insulating portion 20 to be removed in FIGS. 4I to 4J. Therefore, when the state of the portion close to the insulating portion 20, for example, the concentration distribution or the like of the impurity diffusion layer, becomes nonuniform, the image pickup performance decreases. Since the insulating portion 20 can suppress the diffusion of impurities to the silicon portion 25, i.e., the element formation portion, as described above, a good image pickup performance is obtained. Moreover, since the insulating portion 20 can be removed from the element formation portion 2 at a high selection ratio, over etching of the insulating portion 20 hardly occurs. Therefore, the impurity diffusion layer can be precisely formed in the vicinity of the insulating portion 20. Thus, a backside illumination type image pickup apparatus with high image pickup performance can be stably manufactured. The nitrogen in the insulating portion 20 may be imparted with a function of passivation which prevents the influence of chemicals, moisture, and the like from the outside on the device. Therefore, there is an effect such that a semiconductor device can be manufactured at a stable yield. Moreover, since the formation process of an image pickup apparatus has a higher metal-contamination control level as compared with a general semiconductor process, there is a necessity of protecting the element formation portion 2 from the outside environment as much as possible before the process K of performing the color filter formation process and the like. In the process I and the process J described above, the attachment of the support substrate 26, the removal of the base portion 24, and the like are performed, and thereof the generation of foreign substances, metal contamination, and the like are likely to occur. Thus, it is effective for achieving stable production of products to provide the insulating portion 2 having the passivation effect on the element formation portion 2 to thereby protect the same from the outside environment.

In addition to an image pickup apparatus, the effect such that the increase in performance can be achieved at a high yield is obtained also in a semiconductor device manufactured using an insulating portion as a sacrificial layer, such as a MEMS device having a thin film membrane, a cantilever, and a cavity. In addition thereto, since the SOI substrate achieves an increase in the speed, an increase in pressure resistance, a reduction in power consumption, and the like of a transistor, the SOI substrate can be used also for a semiconductor device using the base portion 24 as a back gate.

According to the embodiment of the SOI substrate, the embodiment of the method for manufacturing an SOI substrate, and the embodiment of the method for manufacturing a semiconductor device described above, the diffusion of impurities to the silicon portion can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-138384, filed Jun. 20, 2012 which is hereby incorporated by reference herein in its entirety.

What is claimed is:

1. A method for manufacturing a semiconductor device comprising;
   preparing a SOI substrate;
      wherein the SOI substrate comprises:
      a silicon portion;
      a base portion; and
      an insulating portion provided between the silicon portion and the base portion and containing a silicon compound,
      the insulating portion having a first region, a second region, and a third region in the stated order from the silicon portion side,
      a nitrogen concentration of the first region being lower than a nitrogen concentration of the second region and an oxygen concentration of the first region,
      a nitrogen concentration of the third region being lower than the nitrogen concentration of the second region and an oxygen concentration of the third region, and
      a thickness of the first region being larger than a thickness of the third region,
   forming a photoelectric conversion element on the silicon portion of the SOI substrate; and
   removing the base portion and the third region and forming at least one of a color filter and a microlens on the first region.

2. The method for manufacturing a semiconductor device according to claim 1, wherein the preparing of the SOI substrate comprises:
   forming a silicon oxide film on a silicon plate, at least a portion of the silicon plate serving as the silicon portion of the SOI substrate;
   forming an insulating film by subjecting the silicon oxide film to plasma nitridation; and
   heat-treating the insulating film in an oxygen containing atmosphere, thereby forming the insulating portion.

3. The method for manufacturing a semiconductor device according to claim 2, wherein the preparing of the SOI substrate comprises forming the silicon oxide film by subjecting the silicon plate to thermal oxidation treatment.

4. The method for manufacturing a semiconductor device according to claim 2, wherein the preparing of the SOI substrate comprises joining the silicon plate and a base member through the insulating portion, and then thinning the silicon plate, so that the base member forms the base portion of the SOI substrate.

5. The method for manufacturing a semiconductor device according to claim 4, wherein in the preparing of the SOI substrate, the base member is a silicon substrate containing boron.

6. The method for manufacturing a semiconductor device according to claim 1,
   wherein at least any one of the following conditions (1) to (3) is satisfied,
   (1) the first region shows a maximum value of the oxygen concentration distribution,
   (2) the second region shows a minimum value of the oxygen concentration distribution, and
   (3) the third region shows a maximum value of the oxygen concentration distribution.

7. The method for manufacturing a semiconductor device according to claim 1, wherein a thickness of the insulating portion is less than 50 nm.

8. The method for manufacturing a semiconductor device according to claim 1, wherein, in at least one portion of the second region, the nitrogen concentration is higher than the oxygen concentration.

9. The method for manufacturing a semiconductor device according to claim 1, wherein the nitrogen concentration of the first region and the third region is less than 1 atomic %, the nitrogen concentration of the second region is 1 atomic % or more, and the maximum value of the nitrogen concentration in the second region is 2 atomic % or more and 30 atomic % or less.

10. The method for manufacturing a semiconductor device according to claim 1, wherein a thickness of the third region is less than 5 nm.

11. The method for manufacturing a semiconductor device according to claim 1, wherein the base portion contains silicon containing boron.

* * * * *